(12) United States Patent
Hyatt et al.

(10) Patent No.: US 10,551,089 B2
(45) Date of Patent: Feb. 4, 2020

(54) SOLAR CONCENTRATOR FOR A TOWER-MOUNTED CENTRAL RECEIVER

(71) Applicant: THE ARIZONA BOARD OF REGENTS ON BEHALF OF THE UNIVERSITY OF ARIZONA, Tucson, AZ (US)

(72) Inventors: Justin J Hyatt, Tucson, AZ (US); Brian M Wheelwright, Tucson, AZ (US); Roger P Angel, Tucson, AZ (US)

(73) Assignee: THE ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 13 days.

(21) Appl. No.: 15/748,792

(22) PCT Filed: Aug. 3, 2016

(86) PCT No.: PCT/US2016/045355
§ 371 (c)(1),
(2) Date: Jan. 30, 2018

(87) PCT Pub. No.: WO2017/024038
PCT Pub. Date: Feb. 9, 2017

(65) Prior Publication Data
US 2019/0017729 A1    Jan. 17, 2019

Related U.S. Application Data

(60) Provisional application No. 62/200,570, filed on Aug. 3, 2015.

(51) Int. Cl.
*F24S 23/77* (2018.01)
*H01L 31/054* (2014.01)
(Continued)

(52) U.S. Cl.
CPC .............. *F24S 23/77* (2018.05); *F24S 20/20* (2018.05); *F24S 23/82* (2018.05); *F24S 25/13* (2018.05);
(Continued)

(58) Field of Classification Search
CPC .... H01L 31/0547; H01L 31/054; F24S 23/77; F24S 23/82; F24S 23/70; F24S 20/20; F24S 25/13; F24S 25/50; F24S 30/452
See application file for complete search history.

(56) References Cited

U.S. PATENT DOCUMENTS

| 608,755 A | 8/1898 | Cottle |
| 642,196 A | 1/1900 | Belcher |

(Continued)

FOREIGN PATENT DOCUMENTS

| AU | 2009246638 | 11/2009 |
| CA | 2722714 | 7/2014 |

(Continued)

OTHER PUBLICATIONS

Royne et al., Cooling of Photovoltaic Cells Under Concentrated Illumination: A Critical Review, Solar Energy Materials and Solar Cells, vol. 86, Issue 4, Apr. 1, 2005, pp. 451-483.*

(Continued)

*Primary Examiner* — Golam Mowla
(74) *Attorney, Agent, or Firm* — Snell & Wilmer L.L.P.

(57) ABSTRACT

A solar concentrator may have a horizontal circular track on the ground, a tower centered on a vertical axis of the track, and a rotatable structure around the track having an upper, concave mounting surface approximating the shape of part of a sphere centered on the top of the tower. Articulated concave mirrors are attached to the rotatable structure, and the mirrors have a focal length approximately equal to the radius of a sphere portion formed by the concave mounting (Continued)

surface. Sunlight is focused at a receiver mounted atop the tower, and the receiver may convert sunlight into thermal or electrical energy. As the position of the Sun changes, sunlight is maintained on the receiver by turning the rotatable structure toward the Sun, turning the receiver about said vertical axis to face the mirrors, and articulating the mirrors toward the receiver in response to the changing elevation of the Sun.

7 Claims, 9 Drawing Sheets

(51) Int. Cl.
    *F24S 23/70*     (2018.01)
    *F24S 20/20*     (2018.01)
    *F24S 25/13*     (2018.01)
    *F24S 30/452*     (2018.01)
    *F24S 30/00*     (2018.01)

(52) U.S. Cl.
    CPC .......... *F24S 30/452* (2018.05); *H01L 31/054* (2014.12); *H01L 31/0547* (2014.12); *F24S 2023/872* (2018.05); *F24S 2030/145* (2018.05)

(56) References Cited

U.S. PATENT DOCUMENTS

| | | |
|---|---|---|
| 670,917 A | 3/1901 | Eneas |
| 811,274 A | 1/1906 | Carter |
| 2,661,672 A | 12/1953 | Fairbanks |
| 2,827,690 A | 3/1958 | Brown |
| 2,904,612 A | 9/1959 | Regnier |
| 3,427,200 A | 2/1969 | Ernest et al. |
| 3,552,941 A | 1/1971 | Giffen |
| 3,586,492 A | 6/1971 | McMaster |
| 3,756,797 A | 9/1973 | Akeyoshi |
| 3,977,773 A | 8/1976 | Hubbard |
| 4,074,996 A | 2/1978 | Hagedorn |
| 4,088,470 A | 5/1978 | Bourg et al. |
| 4,105,429 A | 8/1978 | Delgado |
| 4,107,521 A | 8/1978 | Winters |
| 4,154,219 A | 5/1979 | Gupta et al. |
| 4,180,414 A | 12/1979 | Diamond et al. |
| 4,202,715 A * | 5/1980 | Ziemba .................. F24S 23/72 156/71 |
| 4,217,147 A * | 8/1980 | Ziemba ............... H01L 31/0547 136/248 |
| 4,245,895 A | 1/1981 | Wildenrotter |
| 4,313,746 A | 2/1982 | Juras |
| 4,354,193 A | 10/1982 | Werner |
| 4,395,581 A * | 7/1983 | Girard ................... F24S 30/452 359/853 |
| 4,404,565 A | 9/1983 | Gurney et al. |
| 4,436,373 A | 3/1984 | Kirsch |
| 4,461,278 A | 7/1984 | Mori |
| 4,473,065 A | 9/1984 | Bates |
| 4,525,196 A | 6/1985 | Fecik et al. |
| 4,535,961 A | 8/1985 | Sobeczak |
| 4,547,650 A | 10/1985 | Arditty |
| 4,568,156 A | 2/1986 | Dane |
| 4,575,207 A | 3/1986 | August |
| 4,616,909 A | 10/1986 | Dane |
| 4,678,292 A | 7/1987 | Miyatani et al. |
| 4,805,006 A | 2/1989 | Yamagushi et al. |
| 4,830,678 A | 5/1989 | Todorof et al. |
| 4,909,819 A | 3/1990 | McMaster |
| 4,999,059 A | 3/1991 | Bagno |
| 5,118,543 A | 6/1992 | McColl |
| 5,129,934 A | 7/1992 | Koss |
| 5,143,535 A | 9/1992 | Herrington |
| 5,147,437 A | 9/1992 | Bristol |
| 5,169,456 A | 12/1992 | Johnson |
| 5,215,567 A | 6/1993 | Clark |
| 5,281,249 A | 1/1994 | Hampton et al. |
| 5,363,116 A | 11/1994 | Allen |
| 5,460,659 A | 10/1995 | Krut |
| 5,593,901 A | 1/1997 | Oswald et al. |
| 5,695,538 A | 12/1997 | Goolsbay |
| 5,697,999 A | 12/1997 | Reunamaki |
| 5,787,878 A | 8/1998 | Ratliff, Jr. |
| 5,849,056 A | 12/1998 | May |
| 6,034,319 A | 3/2000 | Falbel |
| 6,091,017 A | 7/2000 | Stern |
| 6,123,067 A | 9/2000 | Warrick |
| 6,257,022 B1 | 7/2001 | Caplan et al. |
| 6,301,932 B1 | 10/2001 | Allen et al. |
| 6,375,135 B1 | 4/2002 | Eason et al. |
| 6,378,339 B1 | 4/2002 | Zalesak et al. |
| 6,498,290 B1 | 12/2002 | Lawheed |
| 6,541,694 B2 | 4/2003 | Winston |
| 6,563,040 B2 | 5/2003 | Hayden et al. |
| 6,566,635 B1 | 5/2003 | Matsen et al. |
| 6,629,436 B1 | 10/2003 | Skeen |
| 6,739,729 B1 | 5/2004 | Blackmon et al. |
| 6,848,442 B2 | 2/2005 | Haber |
| 6,895,145 B2 | 5/2005 | Ho |
| 7,076,965 B2 | 7/2006 | Lasich |
| 7,258,320 B2 | 8/2007 | Tai |
| 7,297,865 B2 | 11/2007 | Terao et al. |
| 7,380,549 B1 | 6/2008 | Ratliff |
| 7,503,189 B2 | 3/2009 | Fukuyama et al. |
| 7,506,847 B2 | 3/2009 | Bailey |
| 8,082,755 B2 | 12/2011 | Angel |
| 8,319,697 B2 | 11/2012 | Conrad |
| 8,350,145 B2 | 1/2013 | Angel |
| 8,430,090 B2 | 4/2013 | Angel |
| 8,505,867 B2 | 8/2013 | Conrad |
| 8,604,333 B2 | 12/2013 | Angel |
| 8,662,072 B2 | 3/2014 | Butler |
| 9,318,635 B2 | 4/2016 | Luo |
| 2001/0036024 A1 | 11/2001 | Wood |
| 2003/0005954 A1 | 1/2003 | Emoto et al. |
| 2003/0070705 A1 | 4/2003 | Hayden et al. |
| 2004/0107731 A1 | 6/2004 | Doehring et al. |
| 2005/0051205 A1 | 3/2005 | Mook et al. |
| 2005/0081909 A1 | 4/2005 | Paull |
| 2005/0166957 A1 | 8/2005 | Imoto et al. |
| 2006/0054162 A1 | 3/2006 | Romeo |
| 2006/0057847 A1 | 3/2006 | Yanagawa et al. |
| 2006/0231133 A1 | 10/2006 | Fork |
| 2006/0243319 A1 | 11/2006 | Kusek et al. |
| 2007/0012934 A1 | 1/2007 | Abu-Ageel |
| 2007/0089774 A1 | 4/2007 | Lasich |
| 2007/0089778 A1 | 4/2007 | Horne et al. |
| 2007/0095341 A1 | 5/2007 | Kaneff |
| 2007/0256726 A1 | 11/2007 | Ford et al. |
| 2007/0272666 A1 | 11/2007 | O'Brien |
| 2008/0000516 A1 | 1/2008 | Shifman |
| 2008/0047605 A1 | 2/2008 | Benitez et al. |
| 2008/0053513 A1 | 3/2008 | Palmer |
| 2008/0092877 A1 | 4/2008 | Monsebroten |
| 2008/0185034 A1 | 8/2008 | Corio |
| 2009/0032102 A1 | 2/2009 | Chen et al. |
| 2009/0056790 A1 | 3/2009 | Tian |
| 2009/0126778 A1 | 5/2009 | Brounne et al. |
| 2009/0277224 A1 | 11/2009 | Angel et al. |
| 2009/0277498 A1 | 11/2009 | Angel |
| 2010/0037937 A1 | 2/2010 | Sater |
| 2010/0095999 A1 | 4/2010 | Menon |
| 2010/0126556 A1 | 5/2010 | Benitez et al. |
| 2010/0139645 A1 | 6/2010 | Whipple |
| 2012/0174966 A1 | 7/2012 | Snipes |
| 2012/0192919 A1 | 8/2012 | Mizuyama |
| 2012/0229911 A1 | 9/2012 | Rodriguez-Parada et al. |
| 2012/0260908 A1 | 10/2012 | Orsello |
| 2012/0312349 A1 | 12/2012 | Farberov |
| 2012/0316017 A1 | 12/2012 | Chiel |
| 2012/0318324 A1 | 12/2012 | Ning et al. |
| 2013/0068285 A1 | 3/2013 | Ni et al. |
| 2013/0206935 A1 | 8/2013 | Majid et al. |
| 2013/0323415 A1 | 12/2013 | Brackley |
| 2014/0053607 A1 | 2/2014 | Angel et al. |

(56) References Cited

U.S. PATENT DOCUMENTS

| | | | |
|---|---|---|---|
| 2014/0090687 A1 | 4/2014 | Den Boer et al. |
| 2014/0116419 A1 | 5/2014 | Hernandez et al. |
| 2014/0130843 A1 | 5/2014 | Kostuk et al. |
| 2014/0160784 A1 | 6/2014 | Badahdah et al. |
| 2014/0201109 A1 | 7/2014 | Tilley |
| 2014/0209146 A1 | 7/2014 | Park |
| 2014/0238387 A1 | 8/2014 | Kroyzer et al. |
| 2014/0251308 A1 | 9/2014 | Wyle et al. |
| 2014/0261387 A1 | 9/2014 | Hansen |
| 2014/0261392 A1 | 9/2014 | Lambrecht |
| 2014/0374550 A1 | 12/2014 | Straeter |
| 2015/0303867 A1 | 10/2015 | Angel |
| 2015/0316639 A1 | 11/2015 | Russ |
| 2015/0323124 A1 | 11/2015 | Erdos |
| 2016/0079461 A1 | 3/2016 | Angel |
| 2016/0238189 A1 | 8/2016 | Angel |
| 2016/0251093 A1 | 9/2016 | Hijmans |

FOREIGN PATENT DOCUMENTS

| | | |
|---|---|---|
| CN | 2597897 | 1/2004 |
| CN | 2599483 | 1/2004 |
| DE | 3104690 | 8/1982 |
| DE | 202007016715 | 3/2008 |
| EP | 1903155 | 3/2008 |
| EP | 1956662 | 8/2008 |
| EP | 1956662 | 12/2009 |
| FR | 2434343 | 4/1980 |
| GB | 770097 | 3/1957 |
| GB | 1529409 | 10/1978 |
| GB | 2471816 | 10/2012 |
| JP | 491610 | 1/1974 |
| JP | 58194751 | 11/1983 |
| JP | 6060934 | 4/1985 |
| JP | 2003069069 | 6/1986 |
| JP | 63021229 | 1/1988 |
| JP | 0598895 | 4/1993 |
| JP | 8194103 | 7/1996 |
| JP | 61119081 | 3/2000 |
| JP | 2000091612 | 3/2000 |
| JP | 2000243983 | 9/2000 |
| JP | 2003258291 | 9/2003 |
| JP | 2005206458 | 8/2005 |
| TW | 332104 | 11/2007 |
| WO | WO2005042420 | 5/2005 |
| WO | WO2008013976 | 1/2008 |
| WO | WO2008043871 | 4/2008 |
| WO | WO2009008996 | 1/2009 |
| WO | WO2009121174 | 10/2009 |
| WO | WO2010051599 | 5/2010 |
| WO | WO2010091391 | 8/2010 |
| WO | WO2012032462 | 3/2012 |
| WO | WO 2012097260 | 7/2012 |
| WO | WO2015117134 | 8/2015 |

OTHER PUBLICATIONS

Kinsey et al., Concentrator Multijunction Solar Cell Characteristics Under Variable Intensity and Temperature, Progress in Photovoltaics: Research and Applications, Prog. Photovolt: Res. Appl. 2008;16:503-508.*
Sarah Kurtz, Opportunities and Challenges for Development of a Mature Concentrating Photovoltaic Power Industry, Technical Report : NREL/TP-5200-43208, Nov. 2012.*
Ortabasi et al., Dish/photovoltaic cavity converter (PVCC) system for ultimate solar-to-electricty conversion efficiency-general concept and first performance predictions, Conference Record of the Twenty-Ninth IEEE Photovoltaic Specialists Conference, 2002.*
International Preliminary Report on Patentability dated May 6, 2016 from International Application PCT/US2014/061584.
International Search Report and Written Opinion dated Jan. 27, 2015 from corresponding International Application PCT/US2014/061584.
International Preliminary Report on Patentability dated Jun. 11, 2015 from corresponding International Application PCT/US2013/071974.
International Search Report and Written Opinion dated Apr. 2,2014 from corresponding International Application PCT/US2013/071974.
Nishi et al., USPTO Translation of JP-60-60934, created Dec. 2015, pp. 1-22.
International Search Report and Written Opinion dated Aug. 25, 2009 from International Application PCT/US2009/043381.
International Search Report and Written Opinion from Int'l Application No. PCT/US09/043377 dated May 28, 2010.
International Preliminary Report on Patentability from Int'l Application No. PCT/US09/043381 dated Aug. 16, 2010.
International Search Report and Written Opinion from Int'l Application No. PCT/US09/043378 dated Jun. 9, 2010.
Reply to EPO Communication Pursuant to Rules 161(1) and 162 EPC from related EPC Application No. 09 747 260.9, based on PCT/US2009/043378.
International Preliminary Report on Patentability from Int'l Application No. PCT/US2009/043377 (corrected version) dated Jan. 20, 2011.
Reply to EPO Communication Pursuant to Rules 161(1) and 162 EPC from corresponding EPC Application No. 09 747 261.7, based on PCT/US2009/043381.
Reply to EPO Communication Pursuant to Rules 161(1) and 162 EPC from related EPC Application No. 09 747 259.1, based on PCT/US2009/043377.
Office Action dated Nov. 23, 2012 in German Application No. 11 2009 001 132.2-33.
Office Action dated Oct. 25, 2012 in Japanese Application No. 2011-509577.
Office Action dated Sep. 29, 2012 in Chinese Application No. 200980116969.2.
Office Action dated Oct. 30, 2012 in Application No. GB1019206.0.
Office Action dated Nov. 16, 2012 in Chinese Application No. 200980116959.9.
Office Action dated Nov. 23, 2012 in German Application No. 11 2009 001 135.7-33.
Office Action dated Dec. 4, 2012 in Mexican Application No. MX/a/2010/012356.
Office Action dated Sep. 13, 2012 in Mexican Application No. MX/a/2010/012355.
Examination Report dated Sep. 25, 2012 in European Application No. 09747261.7.
Office Action dated Aug. 22, 2012 in Japanese Application No. 2011-509579.
Examiner's Report dated Aug. 15, 2012 in Australian Application No. 2009246638.
Office Action dated Sep. 15, 2012 in Japanese Application No. 2011-509578.
Examination Report dated Jul. 10, 2012 in European Application No. 09747261.7.
Examination Report dated May 21, 2012 in European Application No. 09747260.9.
Office Action dated Jul. 13, 2012 in Mexican Application No. MX/a/2010/12356.
Combined Search and Examination Report dated Jul. 24, 2012 in Great Britain Application No. 1203267.8.
Examination Report dated Jul. 24, 2012 in Great Britain Application No. 1019139.3.
Office Action dated Jul. 3, 2012 in Chinese Application No. 20090116968.8.
Examiner's Report dated Feb. 23, 2012 in European Application No. 09747259.1.
Examiner's Report dated Feb. 26, 2012 in Great Britain Application No. 1019206.0.
AU; Examination Report dated May 9, 2011 in Application No. 2009246637.
GB; Examination Report dated Sep. 16, 2011 in Application No. GB1019160.9.
AU; Examination Report dated Oct. 4, 2011 in Application No. 2009246639.

(56) References Cited

OTHER PUBLICATIONS

DE; Office Action dated Jan. 10, 2012 in Application No. 11 2009 001 131.4-45.
AU; Examination Report dated May 10, 2011 in Application No. 2009246638.
KR; Notification of Provisional Rejection dated in Sep. 8, 2011 in Application No. 10-2010-7025551.
PCT; International Preliminary Report on Patentability dated Mar. 29, 2011 in Application No. PCT/US2009/043378.
GB; Examination Report dated Sep. 16, 2011 in Application No. GB1019139.3.
GB; Examination Report dated Jan. 11, 2012 in Application No. GB1019139.3.
USPTO; Restriction Requirement dated Dec. 2, 2016 in U.S. Appl. No. 14/632,637.
USPTO; Non-Final Office Action dated Jun. 17, 2015 in U.S. Appl. No. 14/071,417.
USPTO; Final Office Action dated Jan. 8, 2016 in U.S. Appl. No. 14/071,417.
USPTO; Advisory Action dated Mar. 24, 2016 in U.S. Appl. No. 14/071,417.
USPTO; Non-Final Office Action dated Aug. 17, 2016 in U.S. Appl. No. 14/071,417.
USPTO; Notice of Allowance dated Aug. 24, 2011 in U.S. Appl. No. 12/463,026.
USPTO; Notice of Allowance dated Oct. 4, 2012 in U.S. Appl. No. 12/463,016.
USPTO; Office Action dated Jan. 20, 2012 in U.S. Appl. No. 12/463,016.
USPTO; Office Action Restriction dated Oct. 11, 2011 in U.S. Appl. No. 12/463,016.
USPTO; Restriction Requirement dated Aug. 31, 2012 in U.S. Appl. No. 12/463,001.
USPTO; Non-Final Office Action dated Nov. 21, 2012 in U.S. Appl. No. 12/463,001.
USPTO; Notice of Allowance dated Mar. 5, 2013 in U.S. Appl. No. 12/463,001.
USPTO; Non-Final Office Action dated Feb. 14, 2013 in U.S. Appl. No. 13/302,084.
USPTO; Final Office Action dated May 29, 2013 in U.S. Appl. No. 13/302,084.
USPTO; Notice of Allowance dated Aug. 7, 2013 in U.S. Appl. No. 13/302,084.
USPTO; Non-Final Office Action dated Dec. 29, 2016 in U.S. Appl. No. 15/030,692.
USPTO; Restriction Requirement Office Action dated Feb. 14, 2017 in. U.S. Appl. No. 14/647,589.
USPTO; Final Office Action dated Apr. 21, 2017 in U.S. Appl. No. 14/071,417.
USPTO; Notice of Allowance dated May 1, 2017 in U.S. Appl. No. 15/030,692.
USPTO; Non-Final Office Action dated Jun. 20, 2017 in U.S. Appl. No. 14/647,589.
USPTO; Advisory Action dated Aug. 1, 2017 in U.S. Appl. No. 14/071,417.
USPTO; Non-Final Office Action dated Sep. 29, 2017 in U.S. Appl. No. 14/071,417.
USPTO; Notice of Allowance dated Apr. 12, 2018 in U.S. Appl. No. 14/647,589.
USPTO; Final Office Action dated Apr. 27, 2018 in U.S. Appl. No. 14/071,417.
USPTO; Restriction requirement Office Action dated Apr. 5, 2018 in U.S. Appl. No. 15/543,625.
Office Action dated Nov. 23, 2012 in Ferman Application No. 11 2009 001 132.2-33.
Decision to Grant Pursuant to Article 97(1) EPC dated Mar. 28, 2013 from EP Application No. 09747261.7.
DE; Office Action dated Jun. 30, 2015 in Application No. 11 2009 001 131.4-45.
DE; Office Action dated Mar. 13, 2018 in Application No. 11 2009 001 131.4-45.
MX; 1st Office Action dated May 27, 2013 in Mexico Application No. 10/12354.
MX; 2nd Office Action dated Dec. 21, 2013 in Mexico Application No. 10/12354.
MX; 3rd Office Action dated Aug. 5, 2014 in Mexico Application No. 10/12354.
CN 2nd OA dated Oct. 14, 2013 in Chinese Application No. 200980116959.9.
IN First Examination Report dated Oct. 13, 2014 in Indian Application No. 4323/KOLNP/2010.
CA First Office Action dated Nov. 27, 2012 in Canadian App No. 2722714.
Canadian Notice of Allowance dated Mar. 14, 2014 in Canadian App No. 2722714.
EP Comunication pursuant to Article 94(3) EPC dated Jul. 8, 2015 in EP Application No. 09747260.9.
DE Office Action dated Apr. 12, 2018 in German Application No. 112008001135.7.
JP Notice of Allowance dated May 21, 2013 from JP Application No. 2011-509578.
CN 2nd Office Action dated Jun. 3, 2013 in Chinese Application No. 200980116968.8.
CN Third Office Action dated Dec. 23, 2013 in Chinese Application No. 200980116968.8.
First Examination Report dated Nov. 30, 2015 in India Application No. 4327/KOLNP/2010.
Exam Report in Chile Application No. 2015-01453.
International Search Report and Written Opinion dated May 3, 2016 from corresponding International Application PCT/US2016/20415.
International Preliminary Report on Patentability dated Sep. 14, 2017 from International Application PCT/US2014/06/020415.
International Preliminary Report on Patentability dated Dec. 21, 2017 from International Application PCT/US2016/035606.
International Search Report and Written Opinion dated Sep. 13, 2016 from corresponding International Application PCT/US2016/036506.
International Preliminary Report on Patentability dated Jul. 27, 2017 from International Application PCT/US2016/013670.
International Search Report and Written Opinion dated Jun. 9, 2016 from corresponding International Application PCT/US2016/013670.
Leland, J. E90: Self-Replicating Milling Machine. Blog with photos (online). Swarthmore College, 2012. (Retrieved on Jul. 31, 2013).
Dan Friedman, National Solar Technology Roadmap: Concentrator PV, Management Report NREL/MP-520-41735, Solar Energy Technologies Program, Jun. 2007, pp. 1-3.
Geoffrey S. Kinsey, et al., Multijunction Solar Cells for Dense-Array Concentrators, pp. 625-627, 2006, 1-4244-0016-3, IEEE.
David Faiman, Large-Area Concentrators, 2nd Workshop on "The path to ultra-high efficient photovoltaics," Oct. 3-4, 2002, pp. 1-8, JRC Ispra, Italy.
Kumer et al. "Measuring Surface slope error on precision aspheres", (2007), Proc. Of SPIE vol. 6671., pp. 1-9.
Minano et al., "Free-firm optics for Fresnel-lens-based photovoltaic concentrators.", Optics Express, vol. 21, No. S3, Apr. 22, 2013, pp. A496.
International Search Report and Written Opinion dated Nov. 2, 2016 from corresponding International Application PCT/US2016/045355.
International Preliminary Report on Patentability dated Feb. 6, 2018 from corresponding International Application PCT/US2016/045355.
USPTO; Non-Final Office Action dated Jul. 27, 2018 in U.S. Appl. No. 15/543,625.
International Search Report and Written Opinion dated Sep. 18, 2018 in PCT Application No. PCT/US18/30491.
USPTO; Final Office Action dated Feb. 19, 2019 in U.S. Appl. No. 15/543,625.
USPTO; Notice of Allowance dated May 1, 2019 in U.S. Appl. No. 15/543,625.

(56) References Cited

OTHER PUBLICATIONS

USPTO; Non-Final Office Action dated Apr. 19, 2019 in U.S. Appl. No. 15/694,327.

* cited by examiner

SOLAR CONCENTRATOR FOR A TOWER-MOUNTED CENTRAL RECEIVER

CROSS REFERENCE TO RELATED APPLICATION

This application is a U.S. National Phase filing under 35 U.S.C. § 371 of PCT/US2016/045355, filed on Aug. 3, 2016, which claims priority to U.S. Provisional Patent Application Ser. No. 62/200,570 filed on Aug. 3, 2015, both of which are incorporated herein by reference in their entirety.

FIELD OF INVENTION

The present invention relates to solar energy.

BACKGROUND

The present invention is a solar collector that reflects and concentrates sunlight to a central tower-mounted receiver. It may be used, for example, with a thermal receiver to generate heat to be stored and later used to generate electricity after sunset. Such dispatchable generation of electricity may have applications both on and off-grid, as a complement to daytime photovoltaic generation.

In the past, three principal geometries have been used to concentrate sunlight for thermal generation: steerable dish, trough, and heliostats around a central tower. Of the three geometries, dish collectors have the highest optical efficiency (lowest obliquity losses) as the reflector surface always faces the sun directly. The receiver is mounted at the focus of the dish and moves with the tracker. However, dish collectors are not always cost effective. They may have high structural costs because the structure must remain undistorted as it changes orientation tracking the sun, and may, in some instances, also need to withstand rare gale force winds. Dish collectors are in addition limited to relatively small reflector aperture.

Trough reflectors only focus light in one axis, and are thus limited to relatively low concentration.

Large central receiver plants may have a field of heliostat reflectors positioned on the ground around a tower mounted receiver. Each heliostat mirror is turned in two axes to direct sunlight to the receiver. Such collectors have deficiencies in collection efficiency, field efficiency and degree of concentration.

In the case of heliostat reflectors, collection efficiency, as measured by power concentrated per unit area of mirror collector, depends on how any given heliostat is oriented at given time of day, and is reduced for those heliostats oriented with high obliquity loss. Obliquity is the ratio of the area of sunlight reflected by the heliostat to its full mirror area. It is high for a heliostat when the shadow of the receiver falls near it, but low when a heliostat lies between the sun and tower.

Field efficiency is measured by the ratio of mirror to ground area. Heliostats located near the edge of the field to increase concentration must be spaced well apart to avoid self-shadowing, thus reducing overall field efficiency. Increasing the areal density of the field causes the receiver to see a better-filled solid angle, increasing concentration, but this high density increases shadowing losses.

The degree of concentration achievable on the central receiver is also limited by heliostats at the edge of the field. Even for the ideal case when each heliostat mirror is curved to focus a solar image on the receiver, the outer heliostats will form a larger solar image than inner-field heliostats. The receiver size must thus be increased, and the average concentration decreased to accommodate the largest image produced by the most distant heliostats.

In the past, attempts have been made to overcome some of the above limitations. For example, U.S. Patent publication No. 20120325313, to Cheung, et al., and U.S. Pat. No. 9,029,747, to Osello, are directed to systems with mobilized heliostats on circular tracks about a central tower receiver, driven so as to minimize obliquity losses. The heliostats are moved around the tracks to maintain the same azimuthal geometry relative to each other, so that each heliostat needs only motion about a single additional axis to direct sunlight to the tower. U.S. Patent publication No. 2014/0116419, to Ruiz Hernandez, is directed to a system in which heliostats are also driven around circular tracks through the day, clustering opposite the sun, and a central receiver rotated to face the heliostats. These systems reduce obliquity loss, but do not overcome the above limits to field efficiency and optical concentration common to all systems operated with heliostats near ground level.

There thus remains a need for a central receiver system with high optical concentration, high field efficiency, and low self-shadowing losses. Solar collection high optical concentration is valuable for operating receivers at high temperature, required to increase the thermodynamic limit to conversion efficiency. High temperature receivers (>600 degrees C.) have been developed to generate electricity using efficient Rankine and Brayton cycles. At the same time, the collector field preferably combines high concentration with low obliquity loss, low self-shadowing losses and inexpensive mechanical structure. An advance over the present state of the art is needed.

SUMMARY OF THE INVENTION

The present invention is a solar concentrator that focuses sunlight to a central receiver mounted atop a tower. A mobile amphitheater-like structure moves on a circular track about the tower and supports an array of concave mirrors that reflect and focus sunlight onto the receiver. The mirrors are carried in tiered arcs that together approximate the shape of part of a sphere centered on the top of the tower, so the mirrors are all at approximately the same distance from the receiver. Sunlight is focused to the central receiver throughout the day by means of turning the mobile structure to face the sun, turning the receiver to face the structure, and articulating the mirrors individually so that each one focuses sunlight from changing solar elevation into the receiver. In some embodiments, PV modules may be carried on the opposite (sun-side) of the tracks and be moved also on the tracks so as to face the sun through the day and provide direct electrical output during the day.

Because mirror array and cavity receiver rotate together about the same axis, according to the solar azimuth angle, each mirror maintains a fixed position relative to the receiver aperture. The individual mirror articulation required to accommodate changes in solar elevation is for the geometry of this invention no more than 25°, and may be made about a single axis whose orientation depends on the position of the mirror within the array.

In one embodiment of the invention, the circular track comprises two or more concentric rails, and the rigid, amphitheater-shaped structure to support the mirrors rides around on the track with no mechanical connection to the tower.

In another embodiment, the supporting structure is comprised of multiple flat, trapezoidal panel segments that may be assembled on the ground and then lifted into place. The panels may be interlocked to form a rigid, approximately conical/spherical structure once they are raised into operating position. Panels ride at their base on trucks on a singular circular inner track. Cables from the central tower extend to each panel to lift it into place. During high wind or for washing and maintenance, the panels may be lowered to the ground by the cables into a stow position.

For one embodiment of the present invention, ray tracing modeling shows a concentration of 2050× (compared to the ~1000× of typical central receiver plants) and optical efficiency up to 90% (compared to ~70% of typical prior art). These optical efficiency percentages represent the effective reflector aperture including obliquity factor and shadowing losses as a percentage of the physical mirror area, annualized and DNI weighted. A specific, dimensioned preferred embodiment of the present invention occupies an 80 meter diameter circle and delivers 1.4 MW of sunlight at 2050× concentration.

According to the present invention, a solar concentrator comprises a horizontal circular track, a tower centered on the vertical axis of said track, a movable mirror support structure, rotatable around said track and having an upper, concave mounting surface configured substantially in the shape of part of a sphere centered on a focal point wherein said focal point is located coincident with a point on said tower, and a plurality of articulated concave mirrors mounted on said concave mounting surface of said movable mirror support structure, said mirrors having a focal length substantially equal to the radius of said sphere. A receiver is mounted on the tower at said focal point, said receiver being rotatable about said vertical axis and operative to convert concentrated sunlight into thermal or electrical energy, and wherein sunlight is focused onto said receiver by said mirrors throughout the day by rotating said movable mirror support structure around said circular track to face the sun, by turning said receiver to face said movable mirror support structure, and by articulating said mirrors in response to changing solar elevation.

It is an object of the present invention to provide a solar concentrator to efficiently deliver strongly concentrated sunlight to a central, tower mounted receiver, with low obliquity losses and high field efficiency.

It is another object of the invention to use a structure that may be lightly and inexpensively built, yet withstand very high wind.

It is a further object of the invention to provide for initial cost effective construction at moderate scale as well as large scale so as to provide for inexpensive design iterations and testing and evolution of novel receivers and turbines of very high efficiency.

This invention features a single amphitheater-shaped structure supporting mirrors on tiered levels. The geometry is configured so that the mirrors at approximately equal distance from a high, tower mounted central receiver.

It is another feature of the invention that the amphitheater-shaped structure is rotated on a circular track throughout the day to follow the sun from east to west.

It is another feature of the invention that, to focus sunlight on the receiver no matter the solar elevation angle, the mirrors are individually articulated.

It is another feature of the invention that the mirrors may be made all with the same concave shape to focus sunlight on the receiver.

It is another feature of the invention that it may be used to power a tower-mounted receiver of the cavity type, tilted down at fixed angle and rotated so as to directly face the moving mirrors throughout the day.

It is another feature of the invention that the amphitheater-shaped supporting structure may be constructed so it can be lowered to the ground in high wind or for mirror cleaning.

BRIEF DESCRIPTION OF THE DRAWINGS

FIG. 8a shows the arrays at midmorning on the winter solstice.

DETAILED DESCRIPTION

Figure 1A:
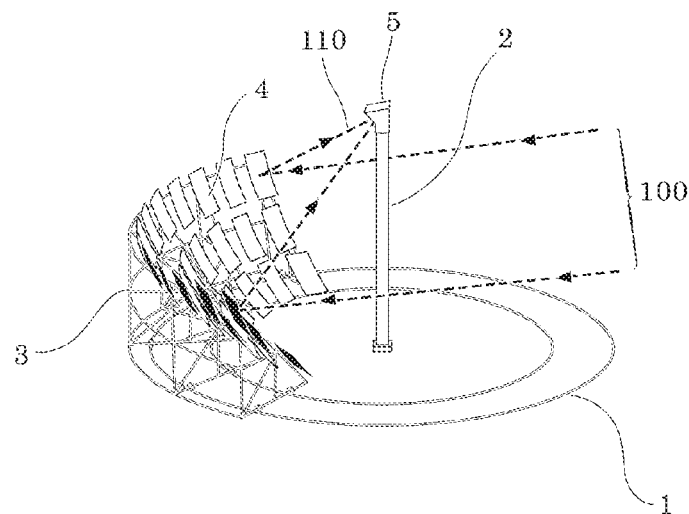
FIG. 1a is a perspective diagram illustrating a preferred embodiment of a solar concentrator according to the present invention in a position corresponding to morning.
Figure 1B:
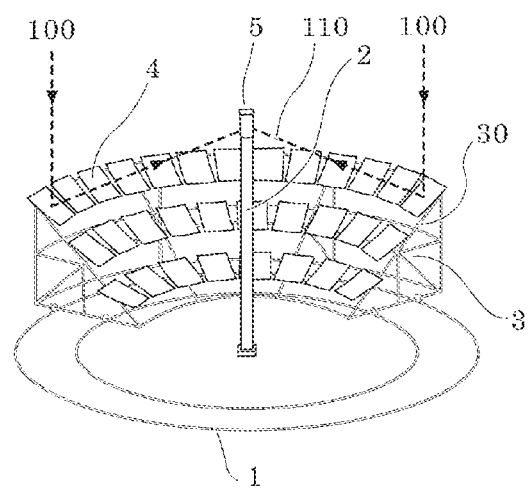
FIG. 1b is a perspective diagram illustrating a preferred embodiment of a solar concentrator according to the present invention in a position corresponding to noon.
Figure 1C:
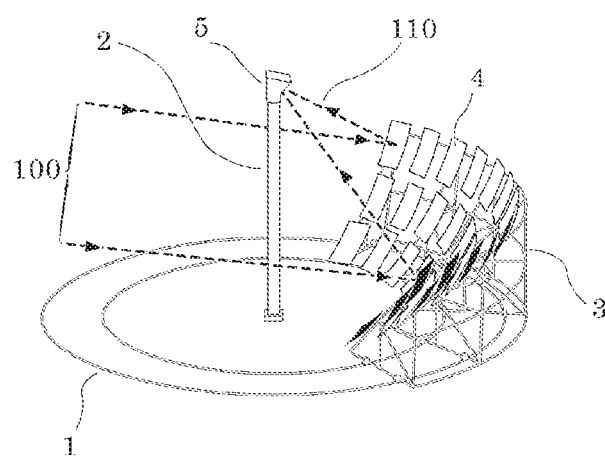
FIG. 1c is a perspective diagram illustrating a preferred embodiment of a solar concentrator according to the present invention in a position corresponding to late afternoon.

FIG. 1a, FIG. 1b, and FIG. 1c show three configurations through the day (morning, noon, and evening, respectively)

of a preferred embodiment of the invention. The horizontal circular track 1 is centered on a vertical tower 2. A mobile amphitheater-like structure 3 rides clockwise through the day on the track 1 around the vertical tower 2. The inner surface 30 of the structure 3 that faces the tower 2 has the approximate shape of a section of a sphere, or a part of a sphere. The top of the tower 2 is at the center of the sphere. An array of concave mirrors 4 is mounted on the inner surface 30 of the structure 3. Each mirror 4 is individually articulated so that incoming rays of sunlight 100 are reflected as rays 110 to a solar receiver 5 mounted on top of the tower 2. The mobile structure 3 rotates around the track 1 throughout the day to maintain the center of the array of mirrors 4 opposite the sun. The receiver 5 is rotated on top of the tower 2 in synchronization with the structure 3, so as to face the center of the array of mirrors 4. The receiver may convert the sunlight into heat, which may be transferred by a transfer medium for storage in a thermal reservoir for dispatchable energy generation, or the sunlight may be converted by the receiver 5 into electricity. The receiver 5 may be of the cavity type to minimize radiative losses.

Figure 2A:
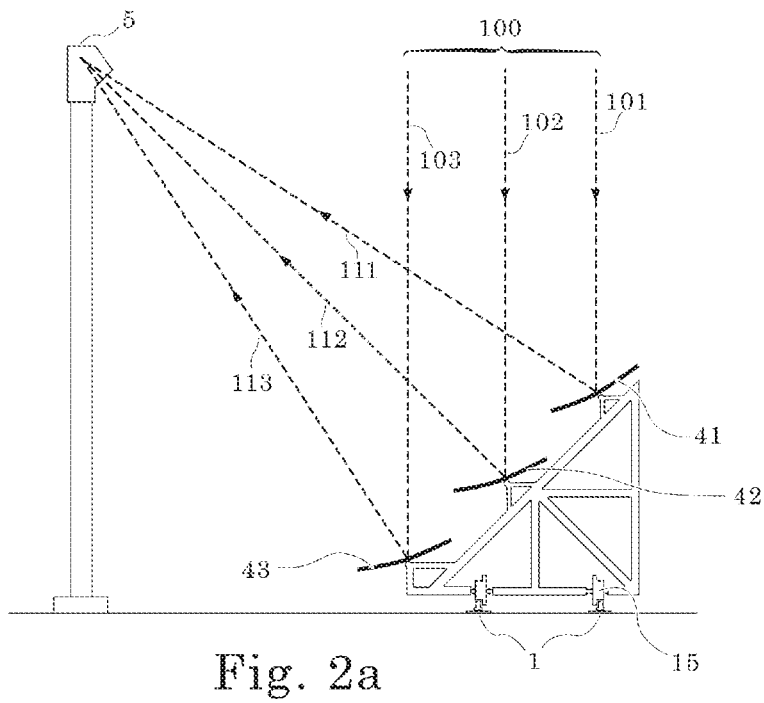
FIG. 2a is a schematic cross section diagram illustrating three articulated mirrors on a rigid support structure riding on a two-rail track, and shows the mirrors tilted when the sun is at the zenith.
Figure 2B:
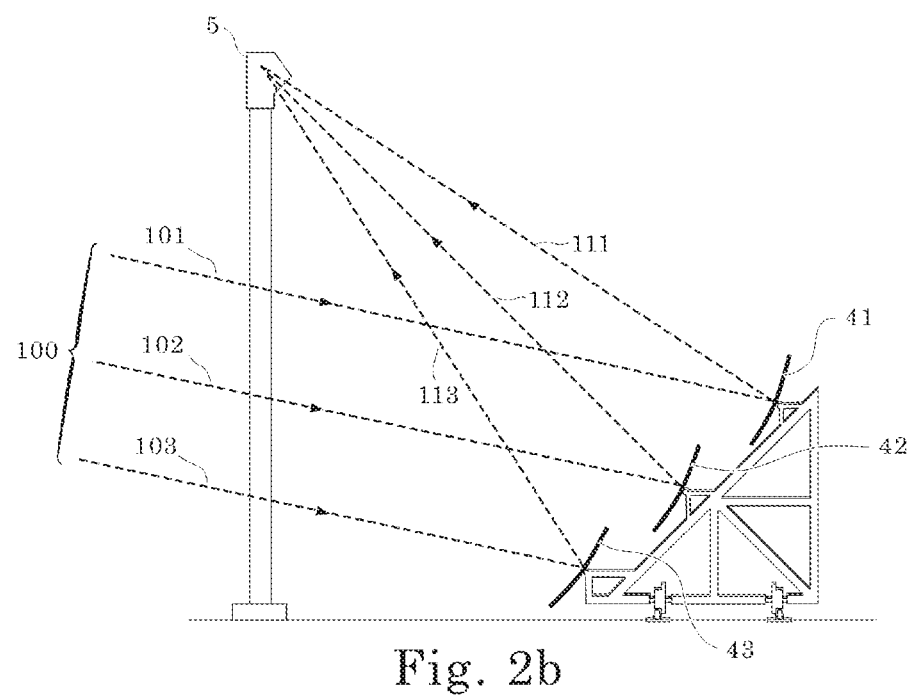
FIG. 2b is a schematic cross section diagram of the apparatus illustrated in FIG. 2a, and shows the mirrors tilted when the sun is at low elevation.

FIG. 2a and FIG. 2b show a schematic detail in cross section of three tiered, articulated mirrors on a rigid support structure on a two-rail track. The mirrors 41, 42, and 43 are individually oriented to keep incoming rays of sunlight 100 reflected (as rays 110 shown in FIG. 1a, for example) to the receiver 5, independent of changes in solar elevation. FIG. 2a and FIG. 2b show three tiers of mirrors, but it will be apparent to those skilled in the art that any number of tiers may be used. FIG. 2a shows the mirrors 4 articulated upward, to direct sunlight 100 coming from high elevation near midday toward the receiver 5. The three mirrors shown, 41, 42, and 43 are articulated individually to obtain the strongest concentration at the receiver. Thus mirror 41 is tilted so incoming ray 101 is reflected as ray 111 to the receiver 5, mirror 42 is tilted so incoming ray 102 is reflected as ray 112 to the receiver 5 and mirror 43 is tilted so incoming ray 103 is reflected as ray 113 to the receiver 5. FIG. 2b shows the mirrors now articulated downward, to direct sunlight 100 coming from low elevation near sunrise and sunset still to the same receiver 5 atop the tower 2. For each mirror the articulation angle depends on both the position of the mirror in the array and the solar elevation angle. The articulation may be approximated by rotation about a single axis, or may be accomplished with dual axes, with both of them restricted to small motions. In general, the range of articulation for any mirror will be no more than ±25°, to cover all solar elevations from zenith to horizon, significantly less than the larger rotations in azimuth and elevation needed for heliostats used in a conventional solar concentrator architecture for central receiver. FIG. 2a and FIG. 2b illustrate also a preferred embodiment wherein the rigid structure 3 is supported entirely by wheels or bogies 15 that ride on concentric rails of track 1.

Figure 3:
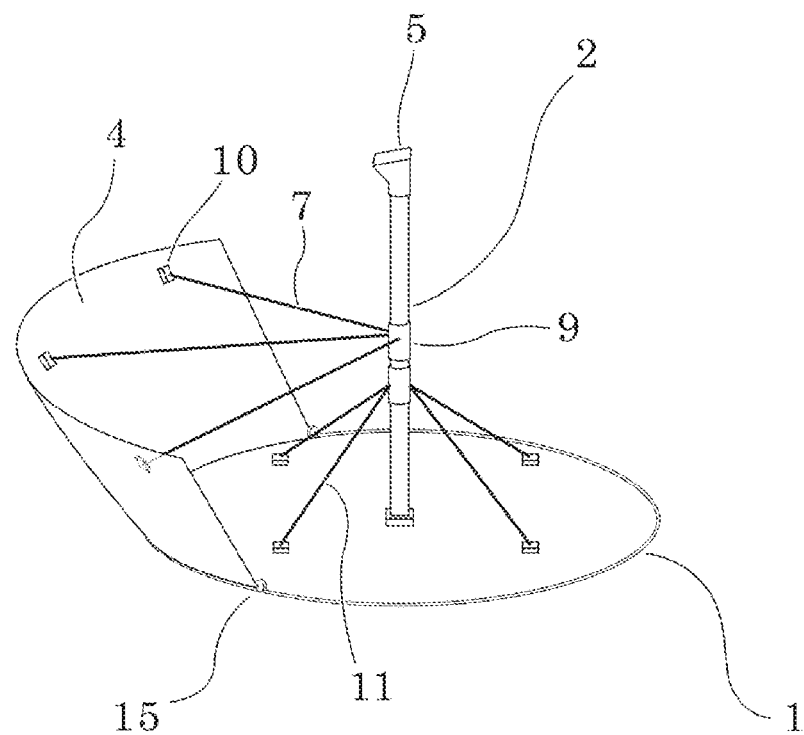
FIG. 3 is a perspective diagram of a preferred embodiment illustrating a rotating rigid mirror support structure turning on a single rail track with supporting cables connecting to the central tower.

FIG. 3 is a perspective diagram of a preferred embodiment illustrating the structure 3 riding on a single rail track 1 and supported in part by cables 7 that connect to the central tower 2 via a bearing 9 concentric with the tower axis that turns with the structure 3. The tower 2 is preferably supported by guy wires 11 that may connect to the ground inside the track 1. Preferably the cables 7 that connect the structure 3 to the bearing 9 and tower 2 are held by winches 10 that may be mounted on the bearing 9 or on the structure 3. The winches 10 may monitor tension in the cables 7 and maintain that tension within a specified range. An upper portion of the tower 2 may rotate with the receiver 5 in synchronization with the mobile reflector structure 3. Preferably the cables 7 that connect the structure 3 to the tower 2 connect to the upper, rotating portion of the tower 2.

Figure 4A:
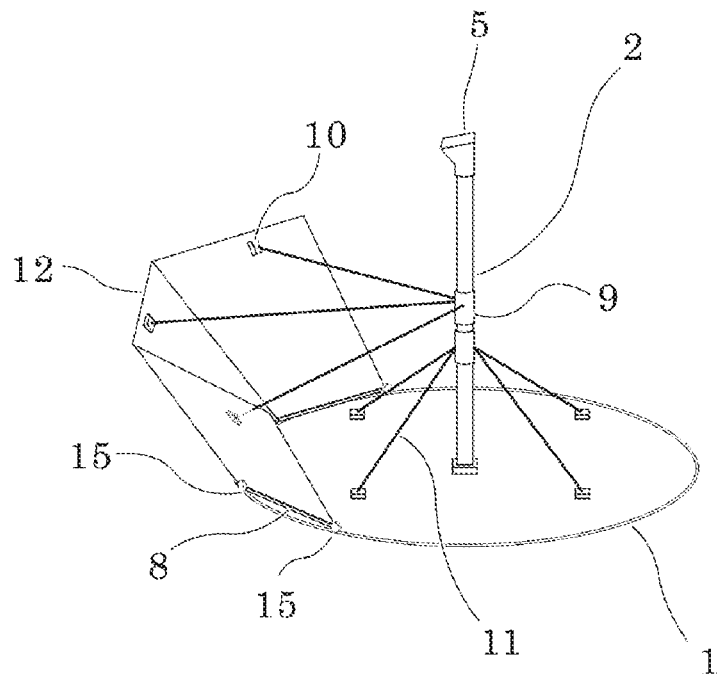
FIG. 4a is a perspective diagram of a preferred embodiment with hinged trapezoidal panels, and illustrates the panels lifted by cables into the operational position with the panels interlocked.
Figure 4B:
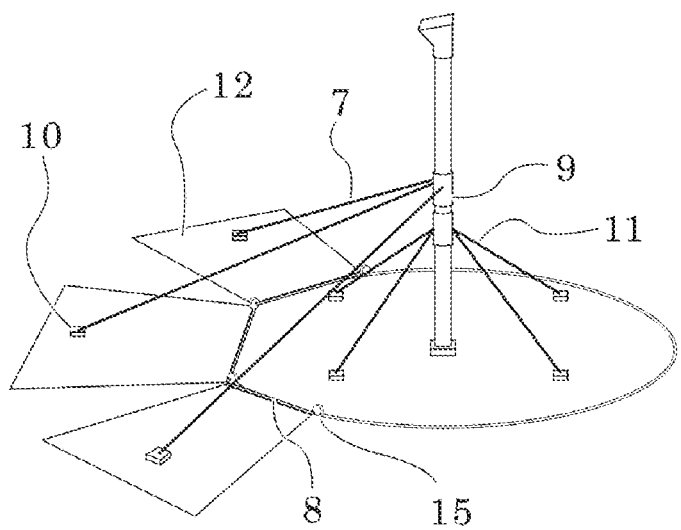
FIG. 4b is a perspective diagram of the same preferred embodiment illustrated in FIG. 4a, and shows the trapezoidal panels unlocked and lowered to the ground.

FIG. 4a and FIG. 4b are perspective diagrams of a preferred embodiment illustrating the structure 3 comprising multiple trapezoidal flat panels 12 that interlock to form an approximately conical arc when in operating position, as in FIG. 4a, but the panels 12 can also be separated and lowered to be flat on the ground, as shown in FIG. 4b. Preferably the panels 12 are raised into position and lowered to the ground by cables 7 and winches 10 that connect to the tower 2. In operation the panels 12 are supported in part at their bases by wheels or bogies 15 riding on a single rail track 1, and in part by tension in the cables 7 that connect to the central tower 2 via the bearing 9. In this embodiment, the structure 3 preferably has at least one hinge 8 near the track 1 that allows one or multiple structure panels 12 to be lowered to the ground.

Figure 5:
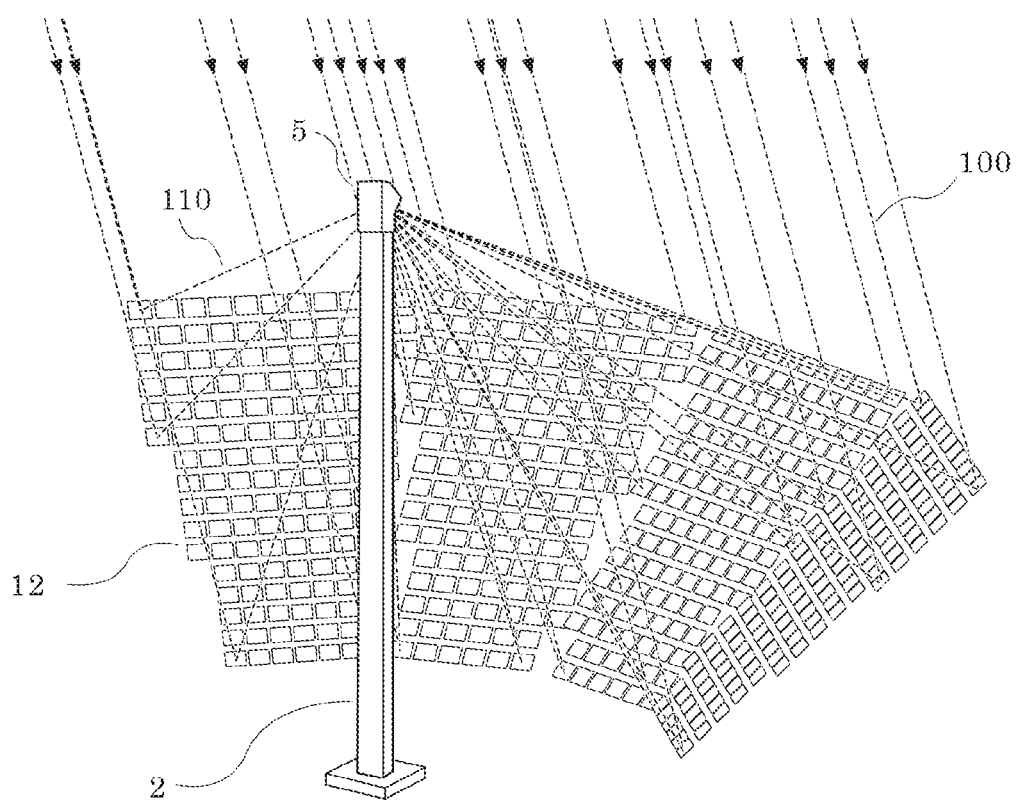
FIG. 5 is a ray diagram illustrating a specific embodiment used to calculate optical efficiency and concentration of the reflector.

FIG. 5 is an optical ray diagram of an illustrative dimensioned embodiment of the type shown in FIG. 4a and FIG. 4b, here with four trapezoidal panels 12 turning on a single rail track 1. Table 1 lists the design parameters used in this illustrative embodiment. The size of the reflectors on panels 12 is modeled as 1.65 m square, a standard size for back-silvered mirrors shaped from float glass. Such mirrors have been proven reliable in solar concentrators. This concentrator uses a total of 552 of these reflectors across four panels 12, for a total reflector area of 1458 m$^2$. All the mirrors are curved with the same focal length of 40 m.

The optical performance has been evaluated by non-sequential ray tracing software, using as input the parameters shown in Table 2.

Figure 6:
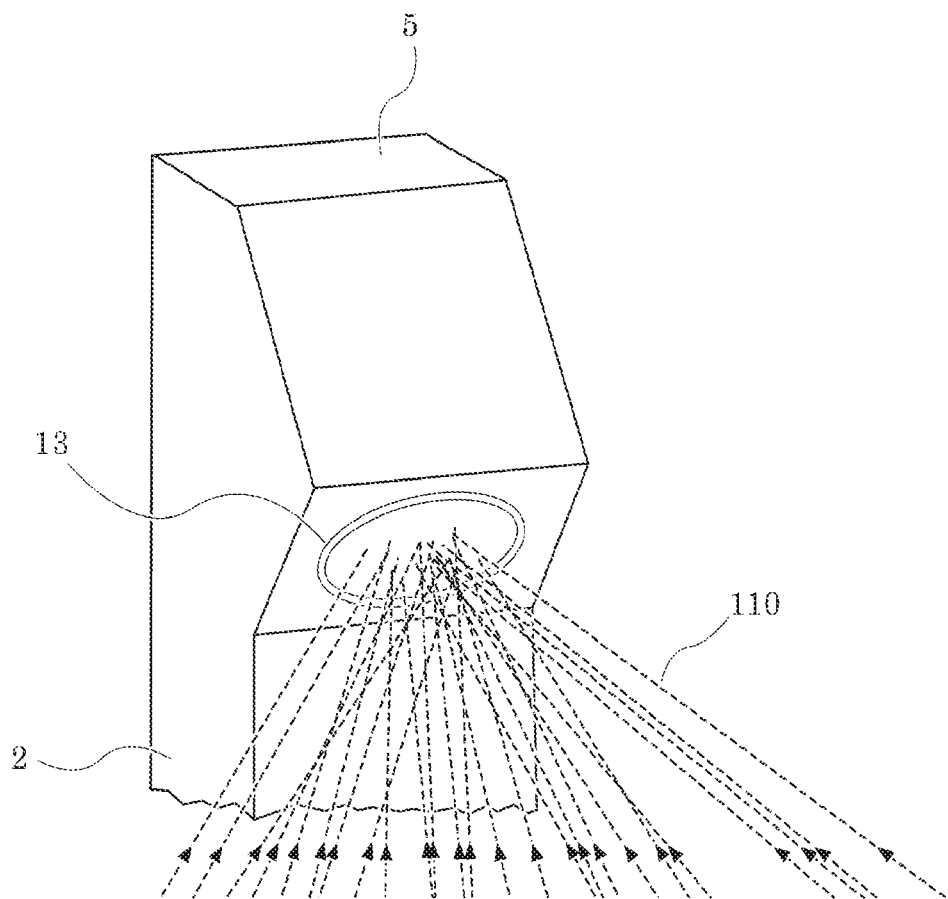
FIG. 6 is a ray diagram illustrating the rays entering a receiver cavity.

FIG. 6 shows reflected sunlight rays 110 from across the full aperture, as computed by the model, arriving at the entrance aperture 13 of the receiver 5. The receiver entrance aperture 13 has a diameter of 0.85 m and an area of 0.567 m$^2$, a factor 2570 times smaller than the primary collection area.

Figure 7:
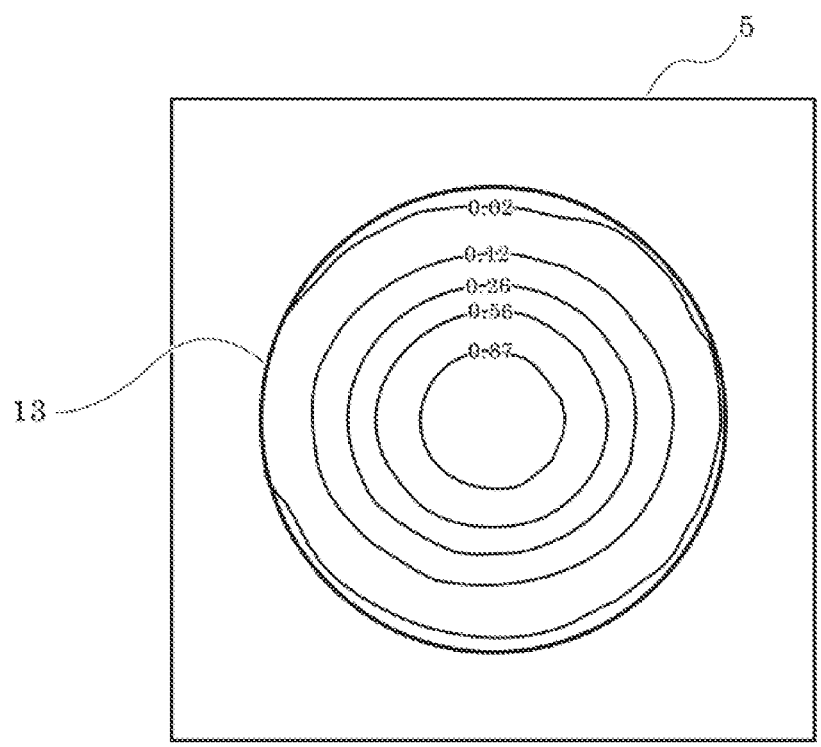
FIG. 7 is a contour plot illustrating the concentration of sunlight at a receiver surface.

FIG. 7 shows a contour plot of the optical concentration of sunlight calculated using the same illustrative embodiment shown in FIG. 5 with the parameters of Table 1 and Table 2. The concentration is calculated including assumed combined mirror and tracking errors of 3.0 mrad RMS and a reflectivity and soiling factor of 89%. At the center the optical concentration is over 7000×, while over the full 0.85 m diameter receiver entrance aperture 13 the average optical concentration is 2050×. Spillage (rays 110 that landed outside the receiver entrance aperture 13) was calculated to be 1.5%.

The performance of this illustrative embodiment is summarized in Table 3.

Figure 8A:
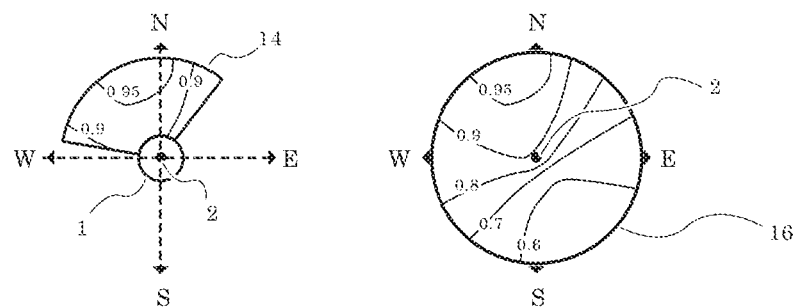
FIG. 8a is a diagram showing a top-down view of the obliquity factor (optical efficiency) computed for two modeled concentrating reflector arrays, where one modeled array represents the present invention, and the other modeled array is for a flat, ground level array representing flat heliostat or horizontally mobile reflector arrays.
Figure 8B:
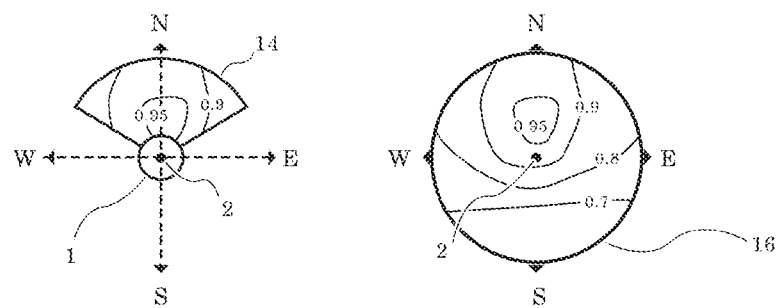
FIG. 8b is diagram of the two modeled concentrating reflector arrays illustrated in FIG. 8a, but FIG. 8b shows the arrays at noon on the solar equinox.
Figure 8C:
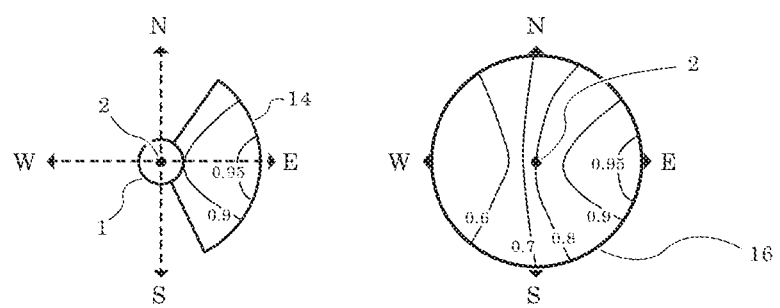
FIG. 8c is diagram of the two modeled concentrating reflector arrays illustrated in FIG. 8a, but FIG. 8c shows the arrays at evening on the summer solstice.

FIG. 8a, FIG. 8b, and FIG. 8c are top-down views of the obliquity factor computed for two modeled concentrating reflector arrays. The left array 14 is for a model of representing the present invention. The right array 16 is for a flat, ground level array representing flat heliostat or horizontally mobile reflector arrays. FIG. 8a, FIG. 8b, and FIG. 8c consist of contour maps of the obliquity factor or optical efficiency of the reflector arrays. The model assumes an array of small mirrors that each track to reflect sunlight to a receiver 5 at the top of a central tower 2. The obliquity factor or optical efficiency at each point is the ratio of the area of sunlight reflected by the reflector to its full mirror area. FIG. 8a shows the arrays at midmorning on the winter solstice. The approximately spherical array 14 has an optical efficiency greater than 0.9 over nearly the entire array. The flat array 16 has a large area with efficiency for some heliostats toward the sun below 0.6. FIG. 8b shows the arrays at noon on the solar equinox. Again, the present invention 14 has an optical efficiency greater than 0.9 over nearly the entire array. Heliostats in the array 16 have generally better efficiency than on the solstice, however it still has a large area with efficiency below 0.7. FIG. 8*c* shows the arrays at evening on the summer solstice. The present invention array 14 has an optical efficiency greater than 0.9 over most of the array while the flat heliostat array 16 has a large area with efficiency below 0.6.

Figure 9A:
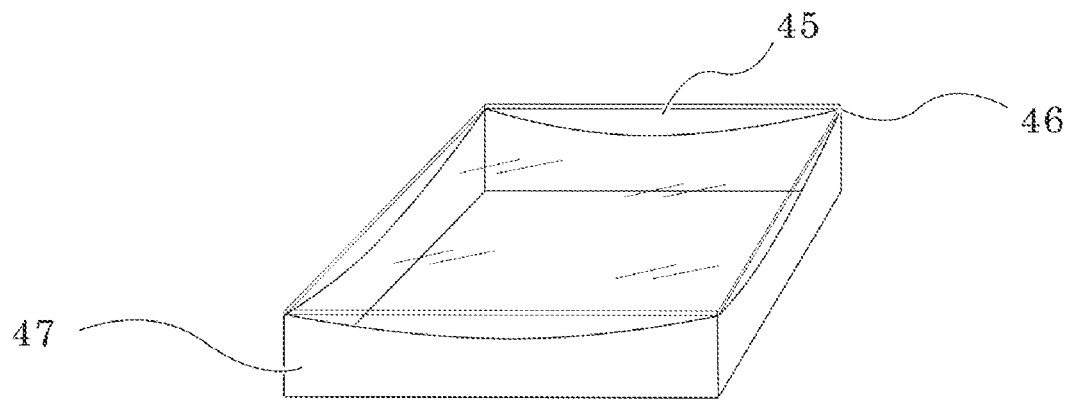
FIG. 9a shows a method to make back-silvered mirrors from sheets of glass, and illustrates the starting point for the method.
Figure 9B:
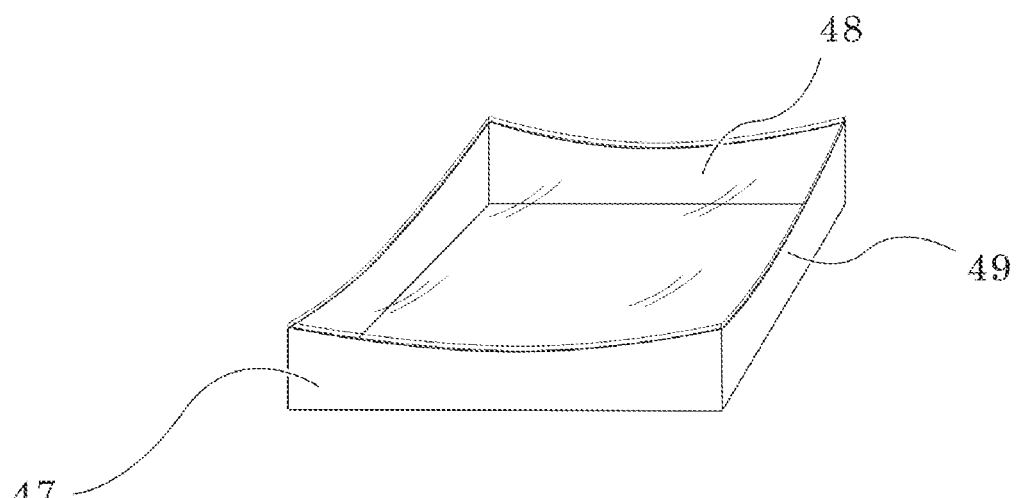
FIG. 9b shows a later step in the method illustrated in FIG. 9a, where the glass has been heated, softened, and plastically deformed under its own weight into a concave shape.

FIG. 9*a* and FIG. 9*b* show a method to make back-silvered mirrors 4 from glass sheets 45 that may be back-silvered after shaping. As shown in FIG. 9*a*, the starting point is a flat glass sheet 45 supported only at its corners 46 by an open frame 47. The frame 47 supports the glass sheet 45 until the glass sheet 45 is softened and plastically deformed under its own weight into a concave shaped glass sheet 48, as shown in FIG. 9*b*. The edges of the glass sheet 48 come to rest on the curved sides 49 of the frame 47, defining their shape, as shown in FIG. 9*b*. Heating is continued until the center of the glass sheet 48 has drooped to the depth required for the correct overall shape, as shown in FIG. 9*b*. The glass sheet 48 may then be annealed or strengthened by rapid cooling with air jets. This method of manufacture involves no contact with the glass sheet 45, 48 except at the perimeter, and thus does not degrade the specularity of the original flat glass sheet 45, which may be of float glass with very high specular reflection on both sides. After the glass sheet 48 has been shaped in accordance with the method shown in FIG. 9*a* and FIG. 9*b*, the back of the glass sheet 48 may be silvered in accordance with conventional techniques known in the art.

Those skilled in the art, after having the benefit of this disclosure, will appreciate that modifications and changes may be made to the embodiments described herein, different design parameters and materials may be substituted, equivalent features may be used, changes may be made in the assembly, and additional elements and steps may be added, all without departing from the scope and spirit of the invention. For example, the receiver 5 would preferably be located at the top of the tower 2; however, the receiver 5 could also be located at a point lower than the top, without adversely impacting the operation of the invention. The horizontal circular track 1 would preferably be located on the ground; however, one could position the track 1 above ground and nevertheless achieve many, if not all, of the advantages of the invention. This disclosure has set forth certain presently preferred embodiments and examples only, and no attempt has been made to describe every variation and embodiment that is encompassed within the scope of the present invention. The scope of the invention is therefore defined by the claims appended hereto, and is not limited to the specific examples set forth in the detailed description.

TABLE 1

| Parameter | Value |
| --- | --- |
| Number of panels | 4 |
| Radius at base of panels | 20 m |
| Radius at top of panels | 40 m |
| Height at top of panels | 20 m |
| Angle subtended by panel assembly at tower | 120° |
| Size of individual reflectors | 1.65 m × 1.65 m |
| Reflector optical prescription | 40 m focal length, spherical |
| Number of reflectors | 552 |
| Total reflector area | 1458 m2 |
| Height of cavity receiver entrance | 40 m |
| Diameter of cavity receiver entrance | 0.85 m diameter |

TABLE 2

| Parameter | Value |
| --- | --- |
| Solar Disk | +/−4.6 mrad |
| Mirror/Tracking Ray Errors | 3.0 mrad RMS |
| Reflectivity and Soiling Factors | 89.0% |

TABLE 3

| Field Optical Efficiency (30° elevation) | 90.9% |
| --- | --- |
| Spillage | 1.5% |
| Average Aperture Concentration | 2050X |

What is claimed is:

1. A solar concentrator comprising:
a horizontal circular track;
a tower centered on a vertical axis of said track;
a movable mirror support structure, rotatable around said track and having an upper, concave mounting surface configured substantially in a shape of part of a sphere centered on a focal point, wherein said focal point is located coincident with a point on said tower such that a radius of the sphere spans between the concave mounting surface and the tower, wherein the concave mounting surface spans and follows a portion of the horizontal circular track;
a plurality of articulated concave mirrors mounted on said concave mounting surface of said movable mirror support structure, said mirrors having a focal length substantially equal to the radius of said sphere; and
a receiver mounted on the tower at said focal point, said receiver being rotatable about said vertical axis and operative to convert concentrated sunlight into thermal or electrical energy;
wherein sunlight is focused onto said receiver by said mirrors throughout a day by rotating said movable mirror support structure around said track to face the sun, by turning said receiver to face said movable mirror support structure, and by articulating said mirrors in response to changing solar elevation.

2. The solar concentrator of claim 1, in which said track comprises two or more concentric rails, and said movable mirror support structure is rigidly constructed and is driven around on said rails without mechanical connection to said tower.

3. The solar concentrator of claim 1, in which said track comprises a single circular inner rail and said movable mirror support structure is rigidly constructed and rides on one or more trucks on said rail, with cables to said tower to balance any outward overturning moment.

4. The solar concentrator of claim 3, wherein said track is located on a ground surface, and said movable mirror support structure is composed of one or more flat panels that are rigidly locked together during operation, wherein said flat panels are configured to be unlocked and lowered to the ground surface from hinges at their bases, by extending said cables from said tower.

5. The solar concentrator of claim 1, wherein said mirrors are concave mirrors of back-silvered glass, wherein said mirrors are made by a method in which a flat glass sheet is heated, softened and plastically deformed into a concave shape while being supported from a perimeter of the glass sheet.

6. The solar concentrator of claim 1, wherein energy provided by said receiver is stored for later use, and further comprising PV panels mounted on said tracks opposite said movable mirror support structure, said PV panels providing electricity during the day.

7. A system comprising a plurality of solar concentrators according to claim 1, wherein said receivers of the plurality of solar concentrators are operative to heat fluid with sunlight, and the fluid heated by the receivers of the plurality of solar concentrators is transferred to a central energy conversion facility.

\* \* \* \* \*